(12) United States Patent
Frith

(10) Patent No.: US 7,102,557 B1
(45) Date of Patent: Sep. 5, 2006

(54) SWITCHED CAPACITOR DAC

(75) Inventor: Peter Frith, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 11/140,951

(22) Filed: Jun. 1, 2005

(30) Foreign Application Priority Data

Apr. 19, 2005 (GB) ................................. 0507862.1

(51) Int. Cl.
- *H03M 1/66* (2006.01)
- *H03M 3/00* (2006.01)
- *G06F 7/64* (2006.01)
- *G06G 7/18* (2006.01)
- *G06G 7/19* (2006.01)

(52) U.S. Cl. ..................... 341/150; 341/143; 327/337
(58) Field of Classification Search ................ 341/143, 341/144, 150, 172, 118, 120; 330/9, 107; 375/259, 244, 247; 327/93, 337, 336, 95; 345/100; 324/678

See application file for complete search history.

(56) References Cited

U.S. PATENT DOCUMENTS

| | | | | |
|---|---|---|---|---|
| 4,384,276 | A | | 5/1983 | Kelley et al. ............... 341/150 |
| 4,451,820 | A | | 5/1984 | Kapral ....................... 341/150 |
| 4,584,568 | A | * | 4/1986 | Zomorrodi ................. 341/150 |
| 4,698,596 | A | * | 10/1987 | Haigh et al. ................ 327/337 |
| 5,072,219 | A | * | 12/1991 | Boutaud et al. ............ 341/150 |
| 5,162,801 | A | * | 11/1992 | Powell et al. ............... 341/150 |
| 5,412,387 | A | * | 5/1995 | Vincelette et al. .......... 341/150 |
| 5,563,597 | A | * | 10/1996 | McCartney ................. 341/150 |
| 5,923,275 | A | * | 7/1999 | Kalb ........................... 341/150 |
| 6,046,719 | A | * | 4/2000 | Dingwall .................... 345/100 |
| 6,081,218 | A | | 6/2000 | Ju et al. ...................... 341/150 |
| 6,118,399 | A | * | 9/2000 | Krone ......................... 341/150 |
| 6,147,522 | A | * | 11/2000 | Rhode et al. ................ 327/93 |
| 6,154,162 | A | * | 11/2000 | Watson et al. .............. 341/150 |
| 6,169,509 | B1 | * | 1/2001 | Abe ............................ 341/150 |
| 6,271,784 | B1 | * | 8/2001 | Lynn et al. ................. 341/150 |
| 6,323,798 | B1 | * | 11/2001 | Abe ............................ 341/150 |

(Continued)

FOREIGN PATENT DOCUMENTS

GB 2 253 753 9/1992

(Continued)

OTHER PUBLICATIONS

J.A.C. Bingham, "Applications of a Direct-Transfer SC Integrator" IEEE Transactions on Circuit and Systems, vol. CAS-31, No. 4, pp. 419-420, Apr. 1984, no date.

(Continued)

*Primary Examiner*—Patrick Wamsley
(74) *Attorney, Agent, or Firm*—Dickstein Shapiro LLP

(57) ABSTRACT

The present invention relates to digital to analog converters, and especially but not exclusively to switched capacitor digital to analog converters (DACs) for digital audio signals. The present invention provides a switched capacitor DAC for converting a digital signal and comprising a feedback capacitor coupled between an input and an output of an operational amplifier; a charging capacitor and a switching arrangement arranged during a charging period to couple a first side of said charging capacitor to a first reference voltage or a second reference voltage dependent on said digital signal, the switching arrangement further arranged during said charging period to couple a second side of the charging capacitor to the second reference voltage or the first reference voltage in anti-phase to the reference voltage coupled to said first side of the charging capacitor; the switching arrangement further arranged during a settling period to couple said charging capacitor to said feedback capacitor.

13 Claims, 9 Drawing Sheets

U.S. PATENT DOCUMENTS

| | | | |
|---|---|---|---|
| 6,362,761 B1 | 3/2002 | Bonardi et al. | 341/143 |
| 6,437,720 B1* | 8/2002 | Yin et al. | 341/150 |
| 6,501,409 B1* | 12/2002 | Lynn et al. | 341/150 |
| 6,573,850 B1* | 6/2003 | Pennock | 341/150 |
| 6,727,836 B1* | 4/2004 | Jeng | 341/150 |
| 6,768,443 B1* | 7/2004 | Willis | 341/172 |
| 6,838,930 B1* | 1/2005 | Huynh | 330/9 |
| 6,873,278 B1* | 3/2005 | Ferguson et al. | 341/144 |
| 6,924,760 B1* | 8/2005 | McLeod et al. | 341/144 |
| 6,927,718 B1* | 8/2005 | Koch | 341/143 |
| 6,952,176 B1* | 10/2005 | Frith et al. | 341/143 |
| 6,961,385 B1* | 11/2005 | Plisch et al. | 375/259 |
| 2004/0008133 A1 | 1/2004 | Manganaro | |

FOREIGN PATENT DOCUMENTS

GB      2 253 754      9/1992

OTHER PUBLICATIONS

D. Senderowicz et al., "PCM Telephony: Reduced Architecture for a D/A Converter and filter Combination", IEEE Journal of Solid-State Circuits, vol. 25, No. 4, pp. 987-996, Aug. 1990, no date.

N.S. Sooch et al., "18-Bit Stereo D/A Converter with Integrated Digital and Analog Filters" Presented at the AES 91st Convention Oct. 4-8, 1991, New York.

* cited by examiner

SWITCHED CAPACITOR DAC

FIELD OF THE INVENTION

The present invention relates to digital to analog converters, and especially, but not exclusively, to switched capacitor digital to analog converters (DACs) for digital audio signals.

Audio signals are increasingly stored as digital audio signals on CDs, computer hard-drives and portable music players such as MP3 devices. The stored digital signals are typically stored as a series of digital word samples of the original analog sound. Such digital audio signals need to be converted into corresponding analog signals for application to audio transducers such as loudspeakers and earphones, and often amplification, mixing, switching, or filtering stages as well.

Various methods of achieving this conversion while maintaining low distortion and other desirable characteristics are known. FIG. 1(a) illustrates an approach where the digital N-bit sampled signal from a digital source 1 such as a CD player in put directly to a N-bit DAC 2 comprising a resistor network. This gives an intermediate analog signal quantized to $2^N$ voltage levels and sample-and-held at the audio sample rate; which signal is then passed through a low-pass filter 3a to give a smoothed analog waveform. Since the audio sample rate is typically only 44.1 kHz or 48 kHz a fast roll-off filter 3a is required to pass signals at 20 kHz but attenuate signals at say 44.1 kHz–20 kHz=24 kHz in order to avoid aliasing effects. Also the DAC 2 needs to have the full resolution of the digital word, so to get say –100 dB distortion, one needs a DAC2 linear to better than 16 bits, which is difficult and expensive and power-hungry. However, for lower-performance applications, say, telephony, this technique may be appropriate. As noted, the DAC may comprise a resistor string and selection switches as drawn, or alternatively, an array of selectable parallel current sources, or switched capacitor circuitry as is known.

FIG. 1(b) illustrates an alternative scheme. The N-bit digital word from the digital source 1 is input to a digital delta-sigma modulator 4, which outputs a single-bit digital stream, at a much higher sample rate, for example 6 MHz. The quantization noise introduced is spectrally shaped to move it out of the audio band. The DAC 4 now need only be a simple 1-bit DAC, essentially a switch between two voltage levels. Its two-level output then requires filtering, but the anti-aliasing requirements are much more relaxed given the higher sample rate, and so a simpler, cheaper filter 3b can be implemented. In implementations the DAC switches may drive voltages into resistors of the following filters, or control the switching of capacitors in switched-capacitor filters, or may control current sources feeding into following filters.

FIG. 1(c) illustrates a further alternative, in which a multi-bit (n-bit) delta-sigma converter 6 is used. The multi-bit output has less in-band quantization noise than the single-bit implementation, allowing better performance for a given clock frequency, and is also less sensitive to clock jitter than a 1-bit scheme. A resistor network DAC7 can be used as shown to generate an n-bit sampled analog intermediate signal, though in practical implementations switched-capacitor or switched-current circuitry may be used. The intermediate waveform, prior to the smoothing filter 3c, has less out-of-band quantization noise so further easing the requirements on this filter. Because of the higher sample rate, known techniques such as dynamic-element matching can be used to move distortion components due to mismatch of component elements of the n-bit DAC 7 out of the audio band.

The term "delta-sigma", as used here in "delta-sigma modulator" or "delta-sigma converter" or "delta-sigma bit stream" for instance, are taken here to encompass any similar scheme, such as "noise shapers", which take a high-sample-rate small-bit-width input data stream and output a lower-sample-rate wider-bit-width data stream, usually but not necessarily shaping the spectrum of the resulting extra quantization noise so that it falls outside the signal band of interest.

In each of the above systems there is a need for a DAC (2, 4, 6), either single bit or multi-bit, and also a need for a filter (3a, 3b, 3c) for smoothing of the output waveform. Typically today the DAC and filter are implemented using CMOS integrated circuit technology. The DAC and filter may be implemented using switched-capacitor techniques, although the some or all of the filtering may be implemented just using a CMOS op amp and passive resistors and capacitors, on-chip or off-chip.

FIG. 2(a) shows a well-known circuit comprising a simple switched-capacitor amplifier 10 acting as a 1-bit DAC, comprising switches 11 and 12 clocked by a 2-phase non-overlapping clock and applied reference voltages Vrefp and Vrefm. In an odd phase O, switches 11a, 11b, and 11c are closed and switches 12a and 12b are open; and in an even phase E, these switch positions are reversed. The closing phase for each switch is indicated by references O and E respectively in the figure. In the odd phase O, the input terminal of charging capacitor C1 is connected via switch 11a to either Vrefp or Vrefm according to the state of the digital input Din, while switch 11b connects the other side of the charging capacitor C1 to a signal ground reference voltage Vg such that capacitor C1 will then be charged to either Vrefp–Vg or Vrefm–Vg. The feedback or output capacitor C2 is shorted by switch 11c to give a voltage Vg at the op amp 13 output Vout. In even phase E, the input side of C1 is connected to ground via switch 12a, and the other plate of C1 is connected to the op amp input via switch 12b. The charge previously residing on C1 is pushed onto C2 by the op amp 13 in order to maintain its virtual ground, while satisfying charge conservation on the plates of C1 and C2 coupled to the op amp input. The output voltage then becomes Vg+(C1/C2)·Vrefp or Vg+(C1/C2)·Vrefm for Din high or low respectively. This output voltage can then be applied to a following switched-capacitor or other filter, or this stage itself can be part of the input stage of a switched-capacitor filter.

FIG. 2(b) shows an alternative single-bit switched-capacitor DAC 15. Circuit elements which are the same as those in FIG. 2(a) are referenced the same. In this case charging capacitor C1 is charged to Vrefp–Vg or Vrefm–Vg in phase O as before, but in phase E it is switched in parallel with feedback or output capacitor C2 by switch 16a.

Charging capacitor C1 thus shares its charge with C2, rather than transferring it all to C2. Assuming C2 was discharged in the previous phase E by the switch RS shown, the op amp 13 will preserve the virtual ground while conserving charge by driving its output to Vrefp·C1/(C1+C2) or Vrefm·C1/(C1+C2).

If switch RS in not closed in later phases, charging capacitor C1 adds increments of charge C1·(Vrefp–Vg) or C1·(Vrefm–Vg) to the virtual ground node each clock cycle, and shares this charge with feedback capacitor C2. If C1 is charged by connection to Vrefp every cycle for a long time, the output voltage asymptotically approaches Vrefp. If C1 is charged to Vrefm every cycle for a long time, the output voltage asymptotically approaches Vrefm. More generally it can be shown that the circuit provides a sampled-data low-pass filter function $$F(z)=\alpha z^{-1/2}(1+\alpha-z^{-1}),$$

where $\alpha=C1/C2$.

Over a long period of time, this low-pass transfer function will cause the output to correspond to the average of the Vrefp/Vrefm pulse train (for example of FIG. 1b), so the output will vary linearly from Vrefm to Vrefp according to the duty cycle of the input digital stream. This is also broadly true of slowly-varying signals, i.e. for signals well within the passband of the low-pass filter, the output signal will correspond to the duty cycle averaged over recent samples.

The circuit of FIG. 2(b) comprises circuitry known as a Direct-Transfer Integrator (DTI) or Direct-Charge-Transfer Integrator, as described for example in J. A. C. Bingham "Applications of a Direct-Transfer SC Integrator" IEEE Transactions on Circuits and Systems vol CAS-31 No 4 pp 419–421, April 1984. In this case the input to the DTI circuitry is Vin, a pulse train with levels Vrefp and Vrefm, produced by switching Vin to Vrefp or Vrefm as shown.

This circuit has various advantages over that of FIG. 2(a):
(i) It provides not only a DAC function, but also a part of the smoothing function.
(ii) To first order, the op amp does not need to supply any charge to C1 or C2, so its main function is merely to preserve the virtual ground voltage against any parasitic effects such as clock-coupling and to drive the following circuit stage.
(iii) The op amp is not reset to zero each cycle, so it does not need to slew to and from zero every cycle.
(iv) The noise gain from the op amp input to Vout is unity in both clock phases, whereas the noise gain of the circuit of FIG. 2(a) in the even phase is 1+C1/C2, which equals 2 for C1=C2, thus doubling the op amp noise contribution in this phase.

Also switch RS can be dispensed with, since the circuit will settle to the average value of the input Vrefp or Vrefm pulse stream regardless of initial conditions, though in practice it may be retained for other reasons, for example to define the output voltage in the temporary absence of clocks or data. FIG. 2(c) shows a circuit where switch RS has been removed, and where the series connection of the two Vref switches and the input O switch is simplified as is routine in the art by replacing them by switches gated by control signals derived by AND-ing the respective data inputs with phase O. This is denoted by labelling the switch 24 Din.O, for example, to denote the switch is controlled by the AND of the O phase and the Din input.

The circuits of FIGS. 2(a), 2(b) and 2(c) are single-bit DACs, suitable for use for example in the system of FIG. 1(b). The idea has also been widely used for multi-bit DACs, suitable for use in the systems of FIG. 1(a) or 1(c), for used for multi-bit DACs, suitable for use in the systems of FIG. 1(a) or 1(c), for example as described in Senderowicz D et al, "PCM Telephony: Reduced Architecture for a D/A converter and filter combination", IEEE J Solid-State Circuits, vol 25, No 4, August 1990, pp 987–996.

FIG. 3(a) shows a 2-bit example of one such structure, which can be extended to higher numbers of bits. The charging capacitors $C1_0$ and $C1_1$ (and any further charging capacitors) may either be binary-weighted for a normal n-bit DAC, or can comprise multiple instances of the same value to allow certain forms of dynamic element matching (DEM) for higher-performance applications. FIG. 3(b) shows a similar circuit where the number of switches is simplified as is routine in the art by replacing the parallel connections of switches connected to the op amp input by a single switch.

FIG. 3(a) shows a 2-bit example of one such structure, which can be extended to higher numbers of bits. The charging capacitors $C1_0$ and $C1_1$ (and any further charging capacitors) may either be binary-weighted for a normal n-bit DAC, or can comprise multiple instances of the same value to allow certain forms of dynamic element matching (DEM) for higher-performance applications. FIG. 3(b) shows a similar circuit where the number of switches is simplified as is routine in the art by replacing the parallel connections of switches connected to the op amp input by a single switch.

A further variation described in U.S. Pat. No. 4,451,820 (Kapral) is based on the circuit of FIG. 2(c) but with a reset switch as shown in FIG. 2(b), and with C1=C2. A shift register is used to provide a series of digital bits corresponding to a digital word input. These are provided in turn, LSB first, to the switched capacitor DAC circuit. In this circuit a charging capacitor C1 is either charged to one or another reference voltage on each clock cycle depending on the serial digital input. This sampled charge is then switched across an op amp in parallel with the equal, second, feedback, capacitor C2 which shares this charge, dividing its accumulated charge by 2 then adding half the charge from C1 to build up an appropriately binary scaled charge for each bit. On the last bit of the word, the accumulated charge is then transferred to a sample and hold circuit, the charging capacitors C1 and C2 are discharged, and the cycle repeats for the next digital word input. Further variations with multiple capacitors are also described.

Using DTI DACs in integrated circuits implementing the system of FIG. 2(c), performance in excess of 100 dB SNR is now routinely achieved. But the market demands increasing performance for the same cost, i.e. for the same silicon area, and lower cost for the same "adequate" performance.

SUMMARY OF THE INVENTION

In general terms the present invention provides additional switching for a switched capacitor DAC in order to increase the charge applied across the charging capacitor during the charging period. This can be used to increase the analog output signal swing and/or reduce the size of the capacitors. Compared with a conventional switched-capacitor DAC, both sides of the charging capacitor are switched between (different) reference voltages rather than just one side, and this increases the signal and thus the SNR allowing increased performance, or alternatively a smaller (cheaper) circuit for a given SNR.

In an embodiment this double switching is applied to a DTI type switched capacitor DAC circuit, the bigger signal swing allowing twice the output amplitude for the same reference voltage. The bigger signal swing also gives 6 db more SNR, or alternatively allows the same SNR with ¼ the capacitor sizes.

In particular in one aspect the present invention provides a switched capacitor digital to analog converter.

In addition to the advantages mentioned above, any parasitic capacitance that may be present at the second side of the charging capacitor only results in an offset error voltage rather than distortion because of the binary nature of the charging cycle as explained in more detail below.

The switching arrangement may be arranged to switch the charging capacitor in parallel with the feedback capacitor during said settling period, or transfer its charge to the feedback capacitor each cycle. The DTI (i.e. the former) implementation is preferred for the advantages outlined above.

In a preferred embodiment the digital signal is a delta sigma bit stream such that the output voltage level follows the duty cycle of the bit stream. However the digital signal may be a series of bits representing n-bit digital words, the switching arrangement further arranged to discharge the feedback capacitor following the nth bit of each word, such that the output voltage at the end of each word corresponds to an n-bit switched analog voltage following the value of the respective words.

Multi-bit (i.e. in parallel) embodiments are also provided comprising additional charging capacitors, and where the switching arrangement is further arranged during the charging period to couple a first side of a respective additional charging capacitor to the first reference voltage or the second reference voltage dependent on a second (i.e. one of the other bit streams) digital signal, the switching arrangement further arranged during said charging period to couple a second side of the additional charging capacitor to the second reference voltage or the first reference voltage in antiphase to the reference voltage coupled to the first side of the additional charging capacitor. The second digital signal corresponds to a different significant bit in a digital word to the first digital signal, the digital word being the combination of the respective bits in a number of parallel bit streams. The capacitance values of the charging capacitors may be binary weighted to correspond with the values of their respective bits in the digital word.

A differential embodiment is also provided which further increases the signal swing. Here the operational amplifier is a differential-input, differential-output amplifier and the embodiment additionally comprises a complementary feedback capacitor coupled between a second input and a second output of the operational amplifier; a complementary charging capacitor and a complementary switching arrangement arranged during a charging period to couple a first side of said complementary charging capacitor to said second capacitor to said second reference voltage or said first reference voltage dependent on the inverse of said digital signal, the switching arrangement further arranged during said charging period to couple a second side of the complementary charging capacitor to the first reference voltage or the second reference voltage in antiphase to the reference voltage coupled to said first side the complementary charging capacitor; and the switching arrangement further arranged during a settling period to couple said complementary charging capacitor to said complementary feedback capacitor.

There is also provided a digital audio device such as a portable digital audio player (e.g. MP3) comprising a switched capacitor DAC as defined herein and wherein the digital signal applied to the DAC is a digital audio signal.

There is also provided a switched capacitor digital to analog converter comprising: a charging capacitor and a switching arrangement arranged to apply a first or second reference voltage to one side of a charging capacitor during a charging period of a switching cycle, the reference voltage applied dependent on an input digital signal level; the switching arrangement further arranged to apply the other reference voltage to the other side of the charging capacitor during said charging period, such that the charging capacitor is charged to the difference between the reference voltages; an operational amplifier and an integrating capacitor coupled in a feedback path between the output and input of the operational amplifier; the switching arrangement arranged to couple the charging capacitor to the input of the operational amplifier following a discharging period of the switching cycle such that the output of the operational amplifier provides an analog output voltage corresponding to a series of input digital signals.

In particular in another aspect the present invention provides a digital to analog converter for converting a digital signal into an analog signal and comprising: an operational amplifier and a switching arrangement; the switching arrangement arranged to deliver a first or second reference voltage, depending on the respective bit of the digital signal, to one side of a charging capacitor during a charging time period; the switching arrangement further arranged to apply the other reference voltage to the other side of the charging capacitor during said charging time period; the switching arrangement further arranged to switch the charging capacitor in parallel with an integrating capacitor between the inverting input and the output of the operational amplifier during a discharging time period.

In another aspect there is provided a switched capacitor DAC.

In another aspect there is provided a method of converting a digital signal to an analog signal.

In a preferred embodiment one of the reference voltages is at ground potential, and the capacitance values of the charging and integrating capacitors are equal.

BRIEF DESCRIPTION OF THE DRAWINGS

Embodiments will now be described with reference to the attached drawings, by way of example only and without intending to be limiting, in which:

As noted above, the circuit of FIG. 2(b) illustrates a direct transfer integrator (DTI) type of switched capacitor DAC. FIG. 2(c) illustrates a modified DTI, and both circuit types can be employed in the single-bit arrangement of FIG. 1(b) or with appropriate modifications in the multi-bit arrangements of FIGS. 1(a) and 1(c).

By appropriate design of the DSM block, the quantization noise in the audio band can be readily reduced, so the SNR is usually limited by thermal noise. The inventors have recognized that this can be improved in certain applications by increasing the signal swing.

Figure 2A:
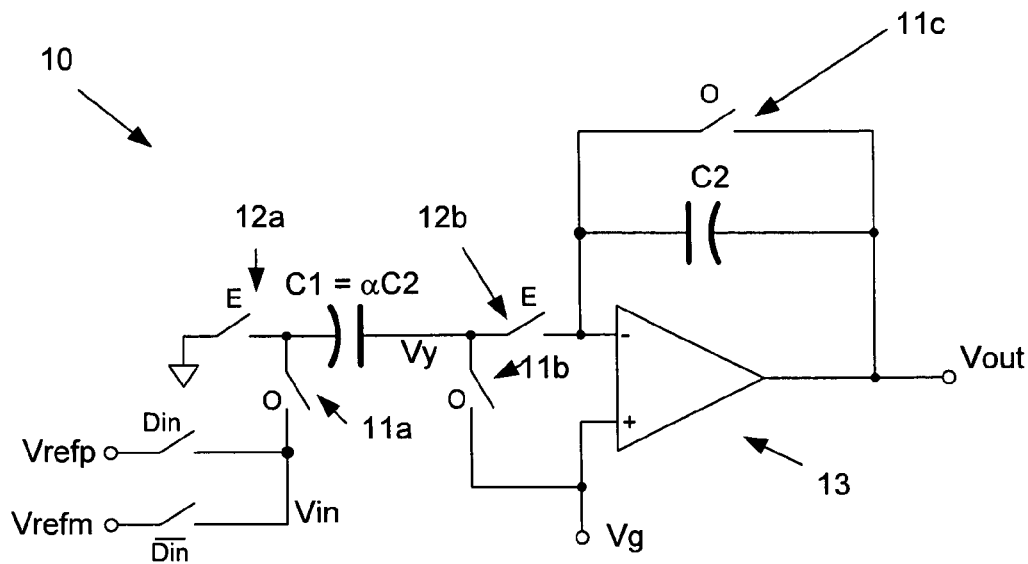
FIG. 2(a) shows a switched-capacitor amplifier arranged as a 1-bit DAC.
Figure 2B:
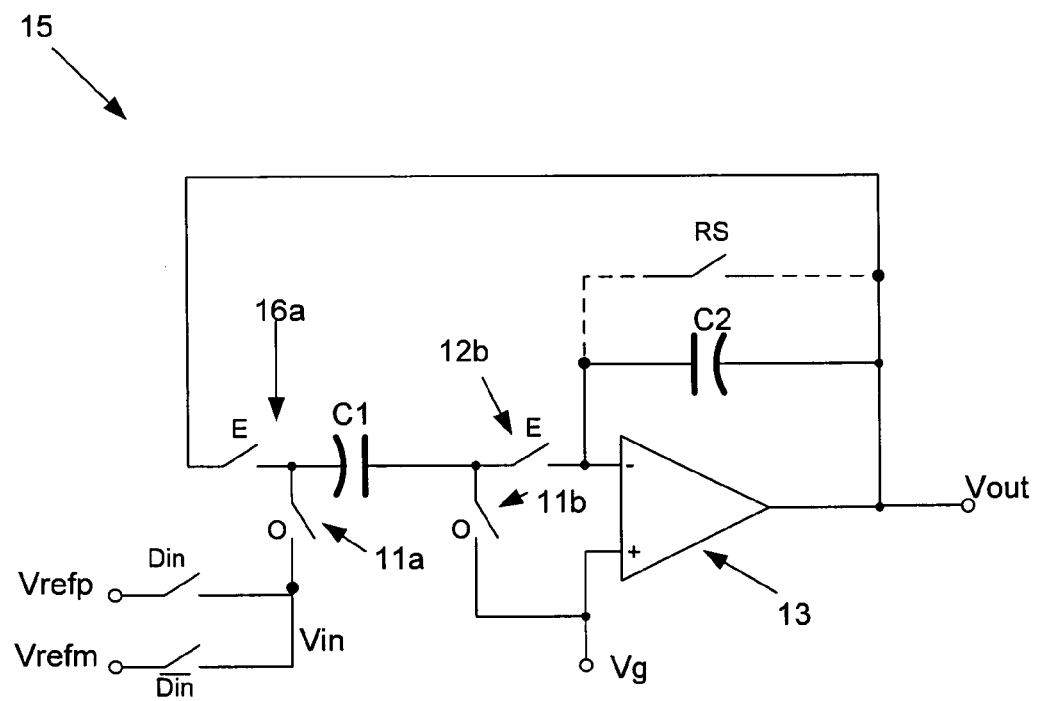
FIG. 2(b) shows an alternative switched-capacitor 1-bit DAC known as a Direct-Transfer Integrator.
Figure 2C:
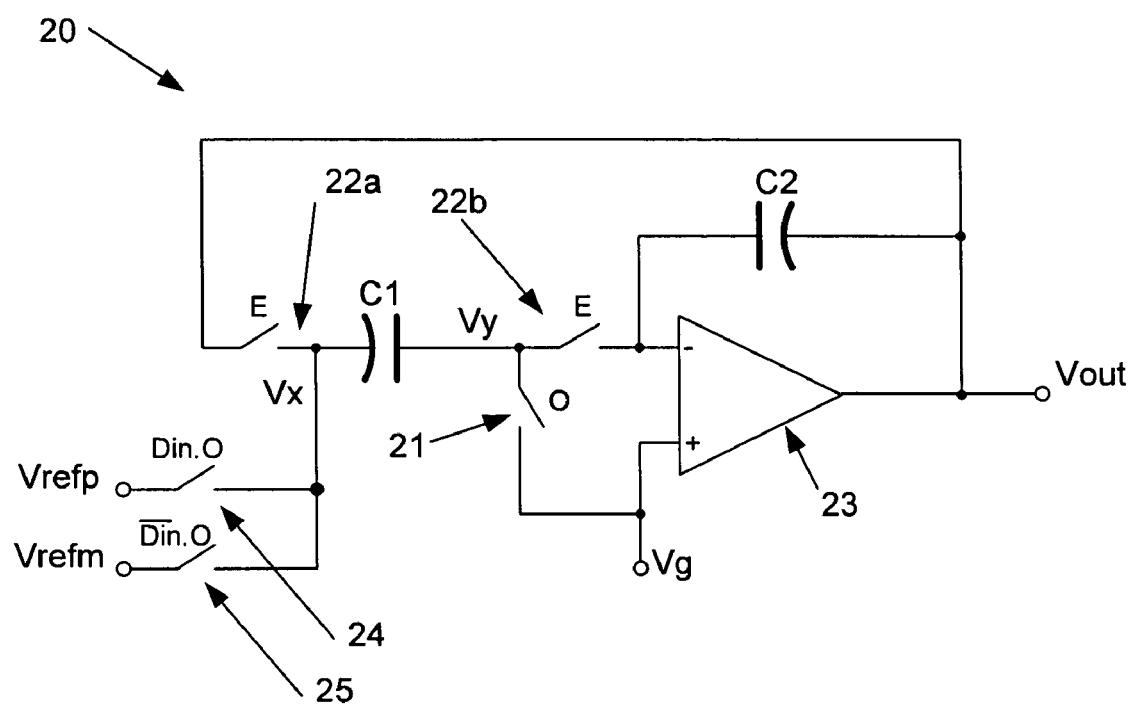
FIG. 2(c) shows a modified arrangement of the switched-capacitor 1-bit DAC of FIG. 2(b)
Figure 3A:
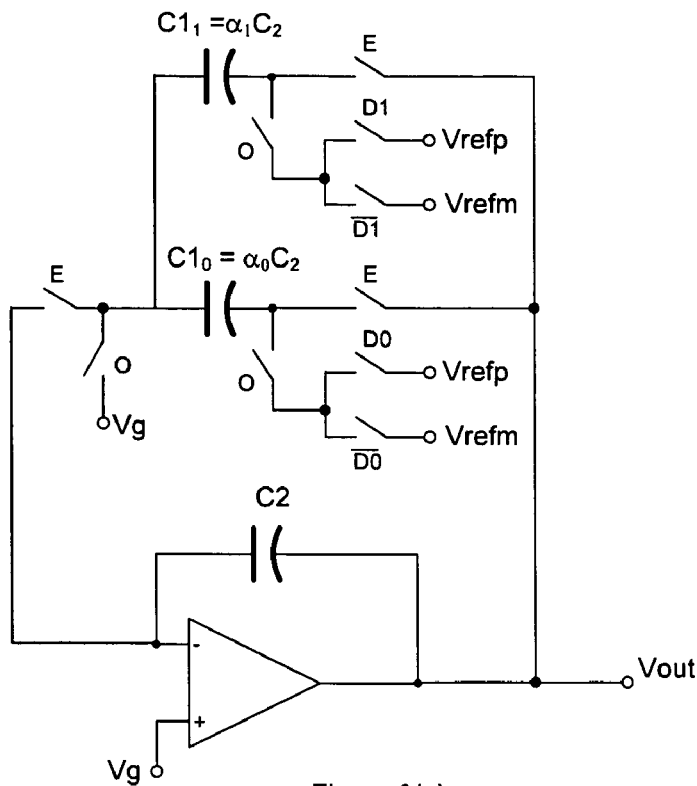
FIG. 3(a) shows a 2-bit modified arrangement of the switched capacitor DAC of FIG. 2(c)
Figure 3B:
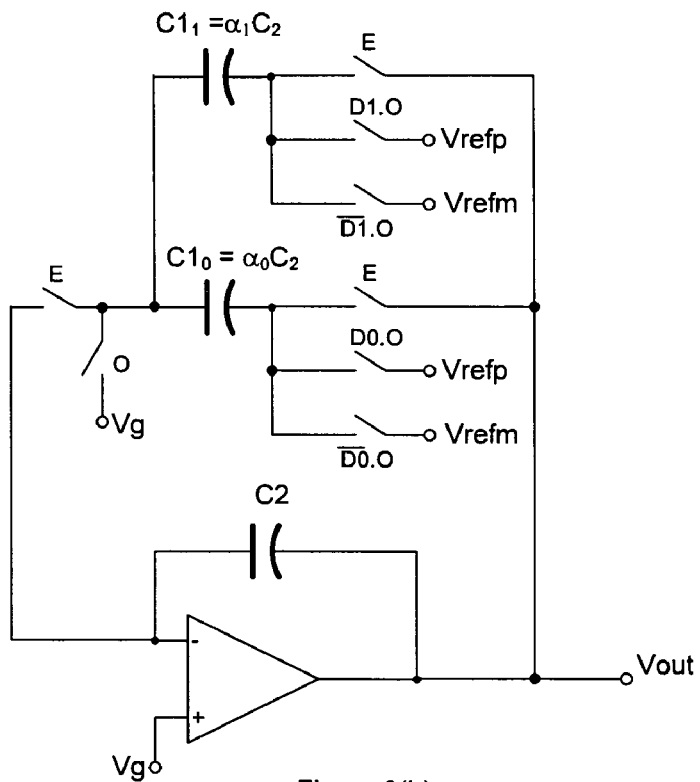
FIG. 3(b) shows a simplified circuit arrangement of the DAC of FIG. 3(a)

For the circuit of FIG. 2(c), thermal noise is introduced via two main sources: the kt/C uncertainty in the voltage across C1 at the end of the charging phase, and op amp noise in both phases. The second source of thermal noise can be decreased, albeit only by increasing supply current and input stage transconductance and area for a given op amp topology. The first is more fundamental, and for a given signal swing can only be improved by increasing the value of C1, thus increasing the required size of silicon area, and hence its cost. Also, for a given filter function, to minimize high-frequency quantization noise, this also involves increasing C2; which further increases the silicon area, and hence cost.

As discussed above, the DTI DAC circuits provide a peak-to-peak output swing from Vrefm to Vrefp. Typically, audio DACs are implemented as integrated circuits operating from a single positive supply, Vdd, and the analog "ground" reference Vg is in fact a decoupled voltage Vmid at approximately mid-rail. To provide good supply rejection Vmmid is also often used as a positive reference Vrefp, and the external ground is used as Vrefm. However, for the DTI circuit, this implies that the output only swings between 0 and Vmid. Also for applications using a preceding delta-sigma modulator, the usable modulation index if less than unity, say 70% to get good distortion performance, which further limits the signal swing. Even if the signal swing is recovered by amplification further down the signal chain, the signal-to-noise ratio for given component values and op amp design is limited by this constraint on signal swing in the first stage. As supply voltages decrease from 5V to 3.3V and below, this constraint becomes more critical. Therefore a structure with the above advantages of the DTI DAC but with increased signal swing is provided by an embodiment.

Figure 4:
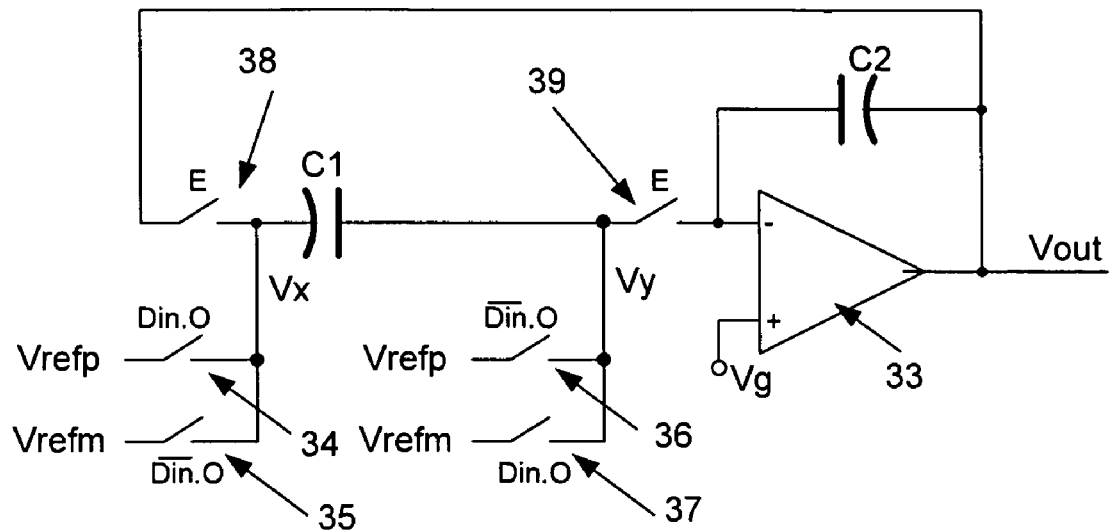
FIG. 4 shows a 1-bit switched capacitor DAC according to an embodiment.

In the embodiment, the structure of FIG. 2(c) is modified as shown in FIG. 4 to allow for greater signal swing and hence reduced SNR due to thermal noise. Referring again to the operation of the circuit of FIG. 2(c) in more detail; the circuit 20 comprises an op amp 23, a charging capacitor C1 and an integrating or feedback capacitor C2, a single-bit digital input Din and an analog output Vout, and a switching arrangement comprising a number of switches 21, 22a, 22b, 24, and 25. Odd or charging phase switch 21, and even or settling phase switches 22a and 22b are driven by non-overlapping clocks odd O and even E respectively. This is indicated by references O and E adjacent the respective switches. Switch 24 is closed, coupling C1 to Vrefp, only in the odd clock phase O, and only then if the data input Din is high, so switch 24 is labelled by Din.O. Similarly switch 25 is closed, coupling C1 to Vrefm, only in the odd clock phase O, and only then if the data input Din is low.

During odd O (charging) phase, charging capacitor C1 is connected between Vx and, Vy where Vx is either Vrefp or Vrefm according to the state of data input Din. Node Vy is connected to (virtual) ground reference Vg by switch 21. So the charge on C1 is C1*(Vx−Vy). If Din=0, this equals C1*(Vrefm−Vg), if Din=1, this equals C1*(Vrefp−Vg).

In the even E (settling or discharging) phase, Vy is connected to the negative input of op amp 23: the voltage on Vy will be equal to Vg because of the feedback around the op amp. Vx is connected to the op amp 23 output, in parallel with capacitor C2. Thus during the discharge phase E the charging capacitor C1 and the integrating or feedback capacitor C2 are coupled in parallel between the inverting input and the output of op amp 23. By charge conservation, since there is no d.c. path to Vy, C1 and C2 will share their charge, giving an output voltage change of (Vrefp−Vout)·(α/(1+α)) or (Vrefm−Vout)·(α/(1+α)) where a=C1/C2.

The integrating capacitor C2 is not discharged between cycles, so that it has a memory or integrating function. After a long sequence of Din=1, C2 will be charged up by C1 to give an output voltage of Vrefp (as the charge on C1 will converge to C1·(Vrefp−Vg) in both clock phases). Similarly, after a long sequence of O's, C1 will tend to charge up C2 to give an output voltage of Vrefm. Similarly, for a duty cycle of γ, the output voltage will tend towards γ·Vrefp+(1−γ)·Vrefm, and for a 50% duty cycle, the output voltage will tend towards (Vrefp+Vrefm)/2.

As noted previously, in practical digital audio implementations, Vrefp and Vg will often be half the supply rail Vdd/2, and Vrefm will be 0V. In this case the output will swing between Vdd/2 and 0V, centered on Vdd/4.

The circuit may be regarded as a switched-capacitor filter with input Vin equal to Vrefp or Vrefm (e.g., Vdd/2 or 0V), and integrating capacitor C2 in the feedback arrangement around op amp 23 providing a low-pass filtering function according to the transfer function $\alpha z^{-1/2}/(1+\alpha-z^{-1})$. This is a low-pass filter with a 3 dB point at approximately $\alpha \cdot fc/\pi$ where fc is the sample clock rate, typically 6 MHz. If Vin is derived from a delta-sigma pulse train or bit stream Din, then the low-frequency audio-frequency components will pass through the filter, but the higher frequency quantisation noise components will be somewhat attenuated. The output can theoretically swing from Vrefm to Vrefp (e.g., zero to Vdd/2), though the modulation index of the delta-sigma modulator used to generate the delta-sigma stream will generally limit this to 70% of this swing, centred on (Vrefp+Vrefm)/2 (e.g., Vdd/4).

FIG. 4 shows a single-bit implementation of a switched capacitor DAC according to an embodiment. This is similar to the circuit of FIG. 2(c), except for the connections to node Vy during the charging (odd) phase. Instead of connecting Vy to the ground reference Vg during this phase, Vy is connected to Vrefp or Vrefm in antiphase to Vx. That is, if Vx is connected to Vrefm, via switches controlled by the data input Din (Din=0), then Vy is connected to Vrefp, and conversely, if Vx is connected to Vrefp (Din=1), then Vy is connected to Vrefm.

This switching arrangement is implemented by "new" switches 36 and 37 connected to node Vy. During the odd phase O, when D=0, switch 36 is closed and switch 37 is open, and when D=1 switch 36 is open and switch 37 is closed. Thus the switches 34 and 37 and 35 and 36 are switched in anti phase antiphase in order that during the charging phase O, the charging capacitor C1 have a voltage across it of (Vrefp−Vrefm) or (Vrefm−Vrefp). This compares with the circuit of FIG. 2(c) which only has Vrefp−Vg or Vrefm−Vg applied across its charging capacitor C1. For example during the charging time period O, switches 34 and 37 are closed in order to charge charging capacitor C1 up to Vrefp−Vrefm. Then in the discharging or settling time period E switches 34 and 37 are opened, and switches 38 and 39 are closed as with the circuit of FIG. 2(c).

In operation, this gives a charge defined by C1·(Vx−Vy) of —C1·(Vrefp−Vrefm) and +C1·(Vrefp−Vrefm) for Din=0 and Din=1 respectively, rather than C1·(Vrefm−Vg) and C1·(Vrefp−Vg) in the circuit of FIG. 2(c).

After a long sequence of D=0, C2 will now be charged to give an output voltage of Vg−(Vrefp−Vrefm); after a long sequence of D=1, C2 will be charged to give an output voltage of Vg+(Vrefp−Vrefm). For intermediate duty cycles, Vout will sweep linearly between these values. For the case where Vrefm=0 and Vrefp=Vdd/2, Vout will sweep from 0 to Vdd, and be conveniently centered on Vdd/2.

Thus, using the same capacitor values, double the output peak-to-peak amplitude is obtained compared with the circuit of FIG. 2(c). The thermal noise sources are unchanged, and so the SNR will be doubled. Also the output is now conveniently centred about Vg, usually Vdd/2. Except for the doubling in gain, the frequency response is unchanged, to first order.

Alternatively, the circuit may by rescaled, reducing capacitor sizes to sacrifice some or all of the gain in SNR for chip area. For example, reducing the capacitor sizes by four will increase the associated thermal noise by 6 dB: this will cancel the improvement in SNR but give a circuit of smaller area. Typically the capacitor array is of a similar size or even larger than the op amp and switches, so overall silicon area occupied by the circuit may be almost halved. Alternatively, the capacitors may be kept the same size, but the op amp input noise specification can be relaxed to take advantage of the increased signal swing, in order to allow for a design with lower power dissipation, or lower silicon area if transistors were previously oversized to reduce flicker noise. This has obvious advantages in portable electronics applications such as MP3 players where small size and low power consumption are important.

Returning to FIG. 2(c), the gain and transfer function is insensitive to any parasitic capacitances on the virtual ground side (Vy) of C1, since this node is always at Vg (except for short settling transients)—i.e. connected to ground or the virtual ground of the op amp. The circuit is also insensitive to any parasitic capacitances on the input side (Vx) of C1, since this node is driven by low-impedance sources, and will always settle out well within the sample period. Also by ensuring the virtual ground side switches turn off before the input switches, the circuit is rendered less sensitive to switch charge injection from the input switches, since these edges now occur too late to affect the charge defined on C1. Charge injection on the other switches is signal-independent, since the nodes involved are always approximately at the constant voltage Vg.

Such parasitic-insensitivity is important to general applications of DTI circuits, where the input voltage spans a continuous range, where signal-voltage-dependence of the parasitic capacitances can introduce distortion, and where accuracy of transfer function can be critical in terms of say the pass-band peaking of a high-order SC filter. But in the application of FIG. 4, with a two-level input, it was realized that parasitic capacitances will only introduce a gain error or a small offset voltage, and not introduce distortion.

Figure 5:
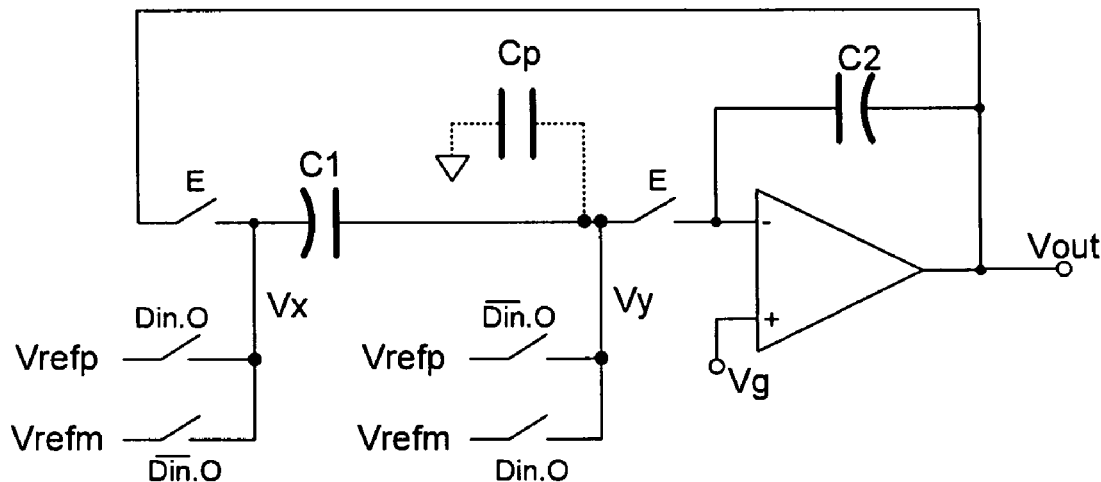
FIG. 5 illustrates a parasitic capacitance in the circuit of FIG. 4.

FIG. 5 is the same circuit as FIG. 4, but with a parasitic capacitance Cp of value β·C2 shown from Vy to ground. Because this capacitance is switched from Vrefp or Vrefm in the odd phase to the virtual ground voltage Vg in the even phase, it will add to the charge to be shared with C2. For Din=0, say, during the odd phase, a charge of C1·(Vy−Vx)= α·C2·(Vrefp−Vrefm) will be placed on the virtual earth ground via C1, but also a charge of β·C2. Vy=β·C2·(Vrefp) will appear on the Vy plate of Cp. During the odd phase, Cp will be discharged to Vg (where Vg is the virtual ground voltage, which may be different from zero either because of op amp offset voltage, or if the system ground reference applied to the op amp non-inverting input is say Vdd/2), while C1 shares its charge with C2. In the asymptotic steady state, in which the charge on C2 does not change, this implies that the charge on C1 during the even phase becomes:

$$Q(C1)=\alpha \cdot C2(Vg-Vout)=\alpha \cdot C2 \cdot (Vrefp-Vrefm)+\beta \cdot C2 \cdot (Vrefp-Vg)$$

so $$Vout=Vg-(Vrefp-Vrefm)-(\beta/\alpha)(Vrefp-Vg)$$

Similarly, for Din=1, $$Vout=Vg-(Vrefm-Vrefp)-(\beta/\alpha)(Vrefm-Vg).$$

If Vrefm=−VR and Vrefp=+VR and Vg=0, $$Vout=Vout, \min=0-(VR-(-VR))-(\beta/\alpha)(VR-0)=-VR(2+\beta/\alpha).$$

$$Vout=Vout, \max=0-(-VR-VR)-(\beta/\alpha)(-VR-0)=VR(2+\beta/\alpha)$$

respectively. So the parasitic capacitance adds to the charge on C1, giving an increase in the effective Vref by a factor $(2+\beta/\alpha)/2=(1+\beta/2\alpha)$ Similarly, if Vrefm=0 and Vrefp=Vdd/2 and Vg=Vdd/s, Vout−Vout, min=Vdd/2−Vdd/2−(β/α) Vdd/2−Vdd/2)=0. Vout−Vout, max=Vdd/2+Vdd/2−(β/α)(0−Vdd/2)−(Vdd/2)· (2+(β/α) respectively. In this case the peak negative voltage Vout, min is unaffected by the parasitic capacitances, since when D=0, Vy switches from Vrefp=Vdd/2 to Vg=Vdd/2, whereas the peak positive voltage Vout, max is increased by a factor $(2+(\beta/\alpha)/2=(1+\beta/2\alpha)$ For intermediate duty cycles, the output sweeps linearly from Vout, min to Vout, max. For 50% duty cycle, the output is (Vout, max+Vout, min)/2 which is equal to 0 for references +/−VR for a dual supply, but an offset of (β/α) Vdd/4 for the single-supply case. Thus the output has a gain error and offset dependent on β.

However, in general the output will be a.c. coupled to later stages, to remove other sources of d.c. offset from the eventual output audio signal. The gain error can be corrected to first order by altering the signal path upstream or downstream, and a tolerance of several percent is not a problem in most applications.

Note that the general conclusion is similar even if p is voltage dependent. In the odd clock phase, Cp will be charged up to one value for Din=0 and another one for Din=1, in the other phase Cp will always return to the fixed virtual ground and so the change in charge due to Cp that C1 must absorb is still only one of two values. Similarly if the clock feed-through of switches on Vy depends on Din, there will still only be two discrete values of charge added to Vy each cycle, one corresponding to Din=0, the other to Din=1, and the signal will still be dependent on an averaging of these two charges with the appropriate duty cycle. So there will be a gain error and probably an offset error (even in the split supply case above, since β for Vout, max will probably be different from Vout, min), but no other distortion of the output signal.

The parasitic capacitances to ground on Vy may include several supply-voltage-dependent components, for instance the drain-substrate junction capacitances of switches on that node. This means the gain may show a dependence on supply voltage.

However since the input signal is still inherently a two-level signal, no harmonic distortion should result. In other words, the total charge stored by C1 and Cp during the odd phase O, Qin, has only two possible values: one, Q1 say, corresponding to Din=1 and the other, Q0, corresponding to Din=0. The signal charge input Qin is thus a sequence of Q1 and Q0. This may be considered as a constant charge pedestal or offset term Qoff=(Q1+Q0)/2 and a symmetrical signal +/−Qdiff=+/−(Q1−Q0)/2. In the even cycle E, after dumping its component of input charge onto virtual ground, Cp However in practice, the parasitic capacitances are small compared to C1. Also an audio system will generally have reasonably well-decoupled supplies to prevent supply is maintained at virtual ground, so its variation has no effect. The Qoff component of Qin will give a constant offset of Qoff/C1. The Qdiff component will be linearly converted to a sampled data signal by the z-transform response $\alpha z^{-1/2}$ $(1+\alpha-z^{-1})$, given above: since this is a linear conversion, no distortion can be caused.

There are still other possible sources of distortion, most of which are common to the circuit of FIG. 2(c). For example the switches need to be designed with low enough on-resistance to charge up the capacitors adequately in the time available: since the switch resistance is signal-dependent, distortion can otherwise occur. The op amp still has to settle linearly enough when driving the load presented by the next stage.

One possible source of distortion is the supply-voltage dependence of Cp. As shown above, the signal-dependence of Cp is not an issue provided that there are two fixed values of charge packet defined, one for Din=0, one for Din=1. But if the supply voltage varies, this can modulate Cp, and hence will also modulate Q1 and Q0. If the supply voltage is modulated at the signal frequency, or a harmonic thereof, so that Cp becomes modulated at the signal-related frequency, harmonic distortion of Qin and hence Vout will result. If there is ripple on the supply at an unrelated frequency, then intermodulation or mixing will result, giving rise to other tones in the audio band. Audio-band tones could also result from mixing of higher-frequency supply ripple with the spectrum of high-frequency quantization noise.

However in practice, the parasitic capacitances are small compared to C1. Also an audio system will generally have a reasonably well-decoupled supplies to prevent supply noise from appearing on the output due to the finite supply rejection of amplifiers or other components of the system.

The charge injection when turning off the switch to Vrefp will be different from that when turning off the switch to Vrefm, even if both switches are the same size. This will give an additional error, similar in effect to an additional parasitic capacitance to ground. However as with the actual parasitic capacitances, this effect will still result in only two values, Q0 and Q1, of equivalent input charge, and hence will only give an offset and gain error rather than distortion.

Any supply dependence of switch charge injection will also cause a loss of supply rejection and possible harmonic or intermodulation tones but this is not worse than the scheme of FIG. 2(c).

Therefore in practice though there may be small gain and offset errors in the output, there is no extra distortion or other effects arising from the parasitic capacitances in schemes where the input capacitor is charged into one of two states per cycle, such as the embodiment described where the reference voltage is switched as described on the "sensitive" end (Vy) of the charging capacitor C1, in order to give double the charge on this capacitor. This can then be translated into double the signal swing or half the capacitor sizes, or a combination, as noted above.

Figure 6:
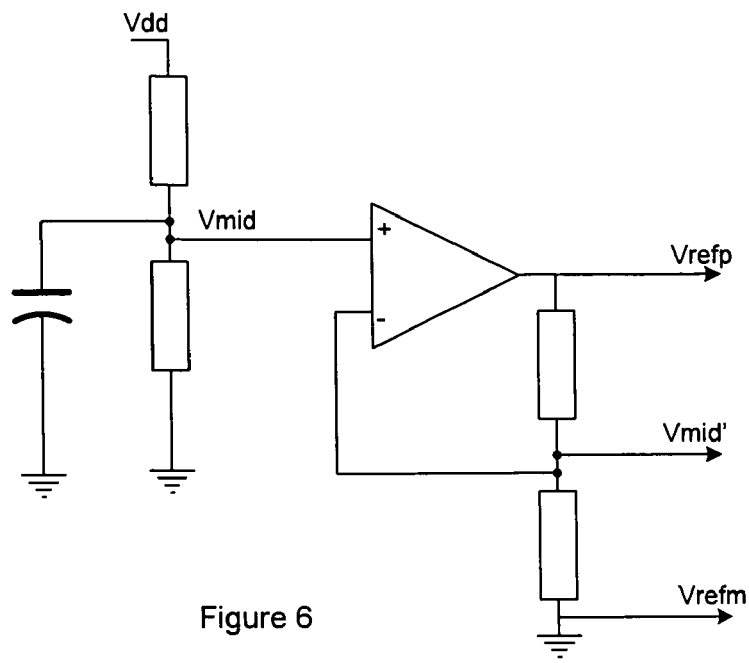
FIG. 6 shows a single supply voltage buffer circuit for supplying DAC's.

In a typical application, Vrefm is ground or 0V, and Vrefp is a decoupled Vdd/2, so the circuit can deliver a peak output from 0V to Vdd. However the delta-sigma stream will possibly only have a modulation index of say 70%, in which case the output audio signal could only swing from about 0.15*Vdd to 0.85*Vdd. Especially with low power supply voltages Vdd, say 3.3V, or possibly even lower for portable battery-powered equipment, it is important to get a wide signal swing, especially if legacy signal levels (e.g. 1V rms) are required. In this case Vrefp may be higher than Vmid. This can be derived by a buffer from Vmid, for example as illustrated in the circuit of FIG. 6, where the op amp positive input Vg may be biased from the unbuffered Vmid or the buffered Vmid'. The output will then swing between Vg−0.70*(Vrefp−Vrefm) and Vg+0.70*(Vrefp−Vrefm), still centered on Vg, but with a larger signal swing since Vrefp is now greater than Vdd/2. For example Vrefp=0.7Vdd, Vrefm=0, Vg=0.5Vdd would give an output range from 0.01*Vdd to 0.99*Vdd, or 0.98*Vdd peak-to-peak. This contrasts with the output range available from the circuit of FIG. 2(c.) which would only give an output range of half this peak-to-peak swing, centred on (Vrefp+Vrefm)/2 =0.35Vdd.

Figure 7:
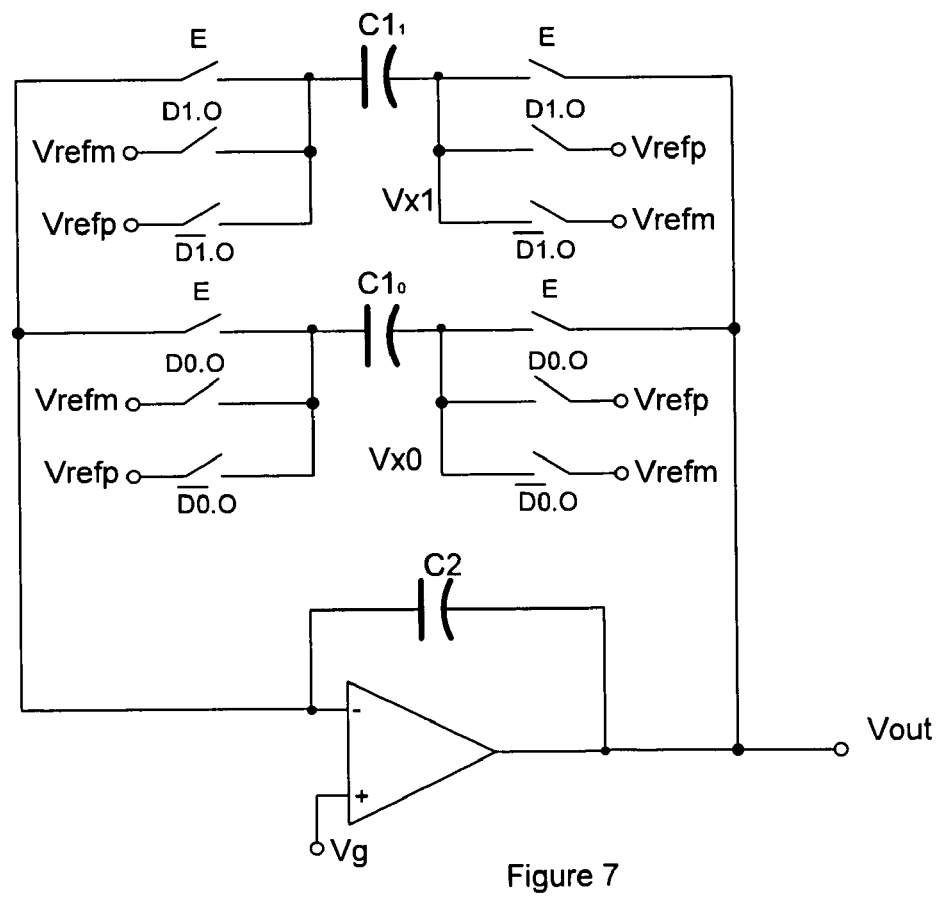
FIG. 7 is a 2-bit extension of the DAC circuit of FIG. 4.

FIG. 7 shows a two-bit extension to the embodiment of FIG. 4, where there are multiple or charging input capacitors $C1_0$ and $C1_1$, driven by respective logic bits D0 and D1. The multiple input capacitors $C1_0$ and $C1_1$ may be binary weighted so that a1=2a0 (where $C1_0=\alpha 0*C2$ and $C1_1=\alpha 1*C2$), in which case D1 and D0 represent the MSB and LSB of a two-bit input word. Alternatively they may be equal-weighted, derived from a "thermometer-code" input word D1, D0. This circuit can obviously be extended to more than 2 bits, with capacitor values corresponding to the weightings, for example binary or equal-weighted, associated with respective bits in the input data word. As with the known schemes, the digital inputs may be scrambled to provide dynamic element matching to reduce the effect of mismatch of capacitors in the array.

As discussed above, parasitic capacitances on the op-amp input side of the input capacitors C1 can give offset and gain error. In an array of equal capacitors, especially in an integrated circuit implementation with usual care in physical layout, these parasitic capacitances will tend to be well-matched. However if the capacitors are binary weighted, special care may need to be taken so that the parasitic capacitances are also scaled in exact ratio to the capacitors, for example laying out the switches as binary multiples of unit switches and replicating any metal interconnect parasitic capacitances associated with each switch, as are known techniques in precision analog integrated circuit or even printed circuit board layout. This may be less important in say a large array, in which most of the array of capacitor elements is the same size, each representing say 4 LSBs of the input multi-bit word, with a few smaller capacitors representing 2-LSB and 1-LSB. A small relative error in the LSB will have only a small effect.

The effect of relative mismatches between capacitor elements and parasitics capacitances of the same nominal value, and the effect of mismatches in the ratio of capacitor elements of ratioed values and their respective parasitic capacitances is also reduced if known Dynamic Element Matching (DEM) techniques are employed. The former effect is reduced by DEM techniques which choose different combinations of equal sized capacitors to achieve the desired total value each cycle, with known algorithms to move the associated errors, out of the audio band. The latter is reduced by DEM techniques which replace say 4-LSB capacitors with combinations of the 1-LSB and 2-LSB capacitors, again with algorithms to shape the associated error noise spectrum out of the audio band. U.S. Pat. No. 6,583,742 discloses such techniques. Such techniques can be used to avoid the effects of random mismatches of capacitors, but also serve to avoid the effects of consistent mismatches caused by parasitic capacitances.

The multi-bit topology also helps to maximize the output audio signal. Although low-pass filtered to some extent by the damped integrator action of the DTI, the output of a single-bit DTI will still have components superimposed on the audio tone which will use up some of the available output headroom. This is especially likely if Vrefp>Vdd/2 is used to maximize the output swing.

Figure 8A:
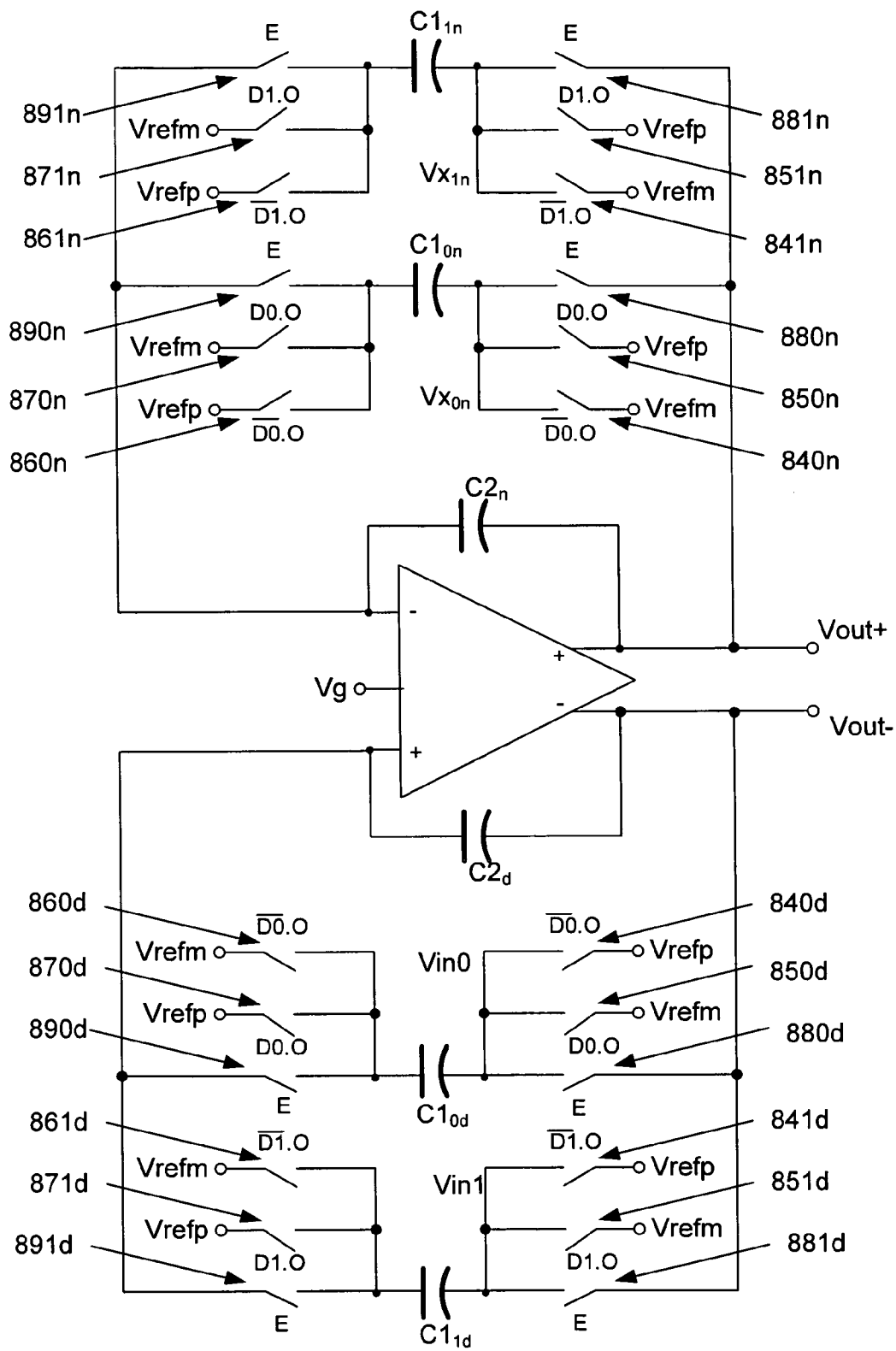
FIG. 8(a) is a differential extension of the DAC circuit of FIG. 7.

Further increase in effective signal swing can be obtained by adopting a fully-differential architecture. FIG. 8(a) illustrates a further embodiment showing a fully-differential implementation of the embodiment of FIG. 7. A fully-differential amplifier, i.e. a differential-input, differential-output amplifier, is used, together with a duplicate of the capacitor array, with corresponding capacitors fed with alternate references as shown. The common-mode output voltage is controlled by circuitry inside the op amp to some convenient defined level, denoted here by Vg, typically Vmid for a single-supply implementation. The differential output voltage is controlled by the feedback applied outside the op amp, in conjunction with the differential-input to differential-output gain of the amplifier.

Thus for example feedback capacitor C2, connected between the negative differential op amp input and its positive output is "matched" or complemented by a corresponding complementary feedback capacitor $C2_d$ connected between the positive differential op amp input and its negative output. Similarly LSB charging capacitor $C1_{On}$ is complemented by a complementary charging capacitor $C1_{Od}$. However the inputs to these two complementary capacitors $C1_{On}$ and $C1_{Od}$ are reversed. During the charging phase O, if D0=1 then switches 850n and 870n are closed about charging capacitor $C1_{On}$ charging this to Vrefp−Vrefm. However with the complementary or corresponding differential charging capacitor $C1_{Od}$, when its corresponding switches 850d and 870d are closed, $C1_{Od}$ is charged to −(Vrefp−Vrefm)

This arrangement gives double the signal swing, i.e., the differential output is the difference between two outputs Vout+ and Vout−, each of which can go between ground and VDD. However, although the signal swing is again doubled, the kT/C noise components are uncorrelated, so only increase by 3 dB, and the op amp noise (assuming a similar input stage) is unchanged, still having unity gain to the (differential) output. The differential architecture may also allow a differential output across the interface between the integrated circuit and the overall system, reducing the effect of noise between the outside ground and the integrated circuit ground.

Figure 8B:
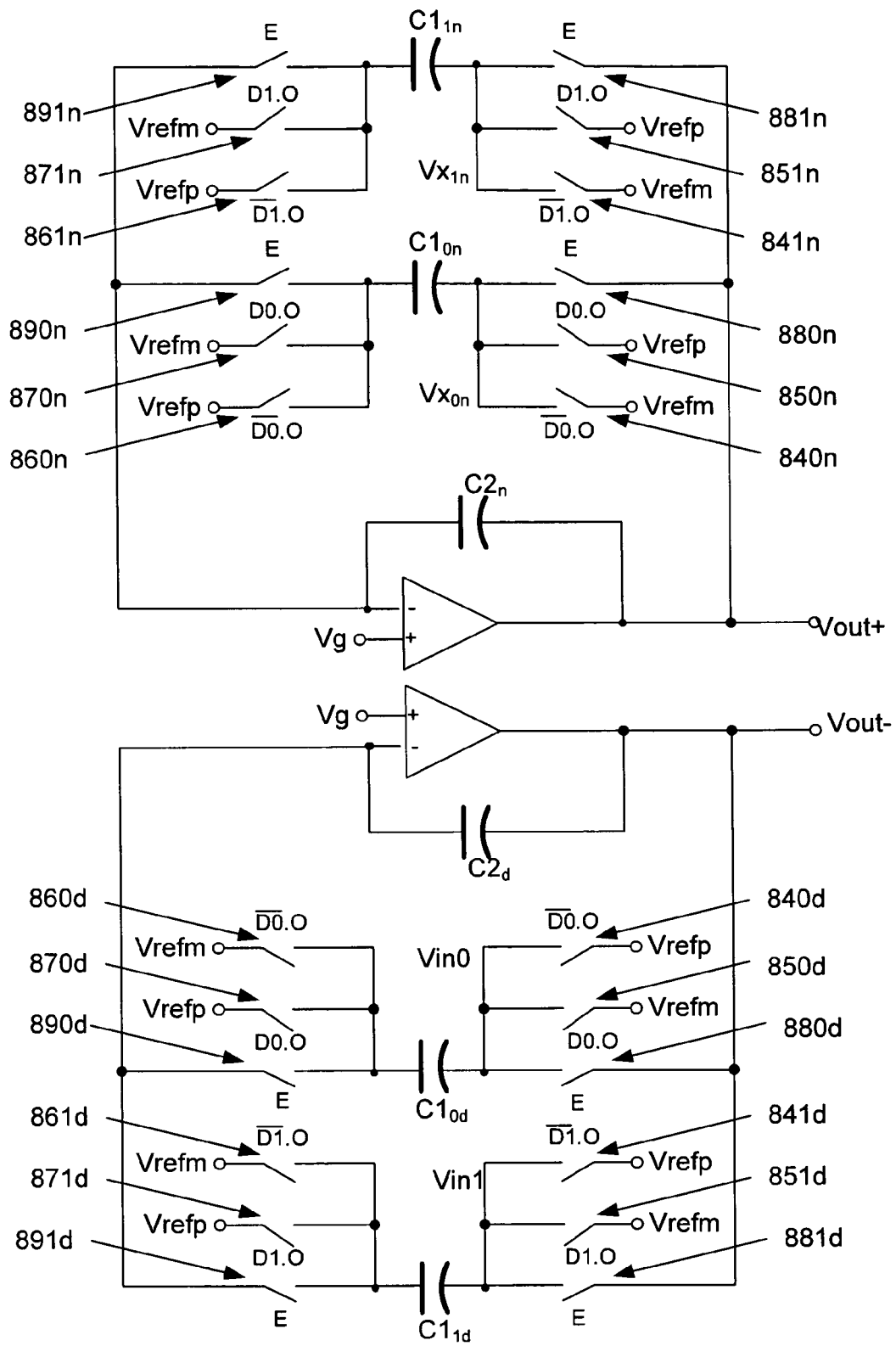
FIG. 8(b) is an alternative arrangement of the circuit of FIG. 8(a) using two op amps to implement the differential op amp of FIG. 8(a)

The differential-input, differential-output amplifier may be designed as a single amplifier circuit, or may comprise two or more amplifier circuits coupled to respective input and output signals, as is known. For example, FIG. 8(b) shows an implementation similar to FIG. 8(a) using two op amps in parallel.

The circuit shown can be extended to include a greater number of bits, or can be simplified to a single-bit scheme, as would be apparent to those skilled in the art.

Figure 1A:
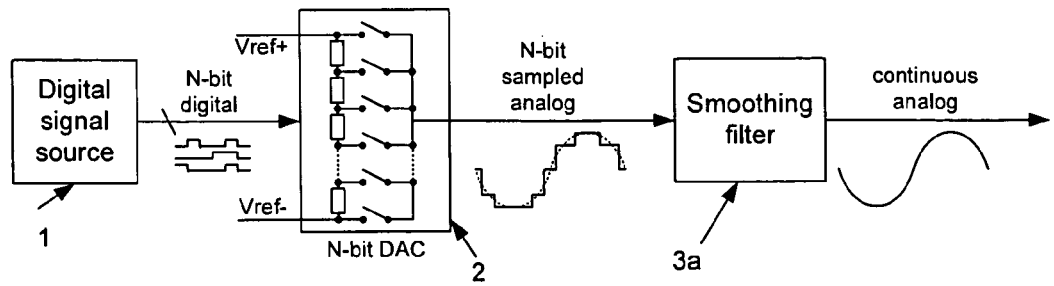
FIG. 1(a) is a digital to analog converter arrangement in which a digital N-bit sampled signal (word) is input directly to an N-bit DAC.
Figure 1B:
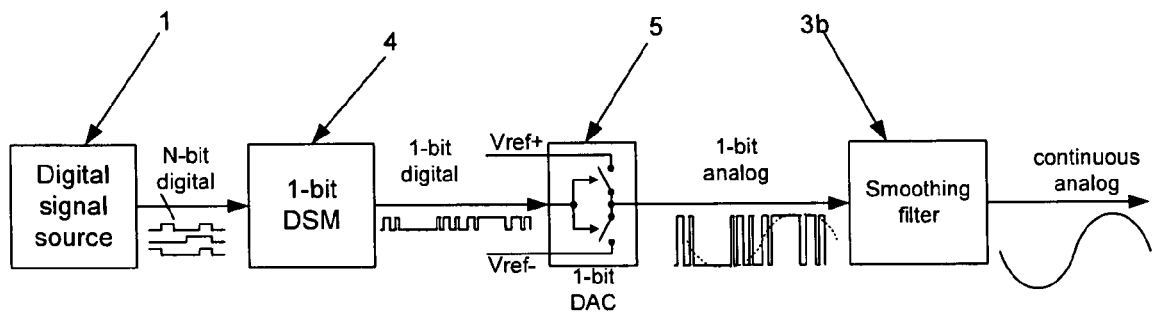
FIG. 1(b) is an alternative arrangement in which a digital delta-sigma single-bit digital bit-stream is applied to a 1-bit DAC.
Figure 1C:
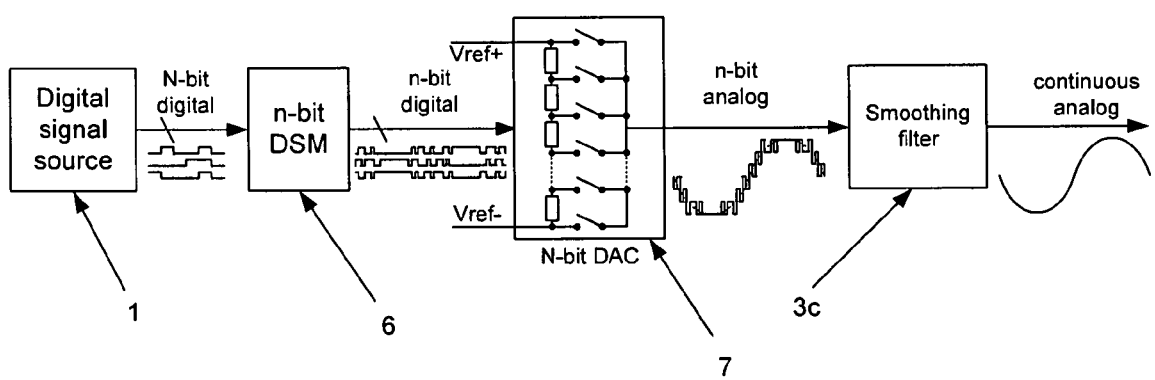
FIG. 1(c) is a further alternative arrangement in which a multi-bit (n-bit) delta-sigma bit stream is applied to an n-bit DAC.
Figure 9:
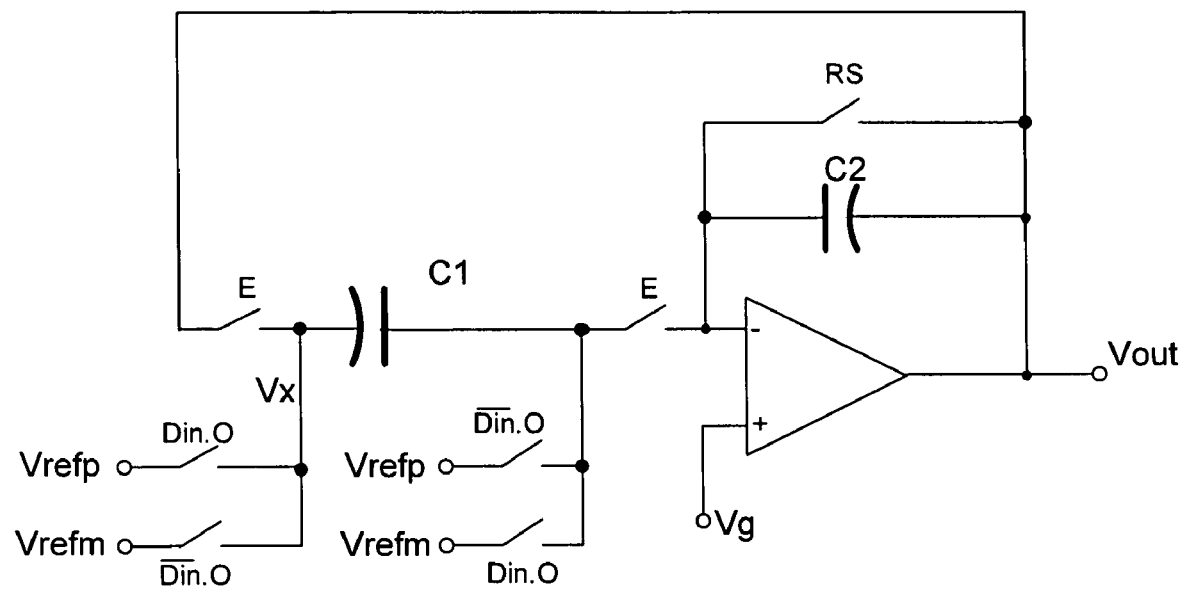
FIG. 9 is an alternative arrangement of FIG. 7 using a reset switch in order to implement a DAC according to another embodiment but which is similar to that of FIG. 2(b).

As an alternative to the multi-bit architecture of FIG. 7, FIG. 9 shows a further embodiment similar to that of FIG. 2(c), but including the reset switch as in FIG. 2(b), and with switching on both sides of the charging capacitor C1. Incoming bits correspond to a digital word, the charge across the feedback capacitor C2 building up as the bits of the word are applied to the circuit. After all of the (n) bits of the word have been applied, the output voltage corresponding to the accumulated charge on C2 is sampled, giving a sampled output voltage corresponding to an appropriate sample level for an n-bit sampled analog waveform, similar to that shown in FIGS. 1(a) and 1(c) for example.

This may be implemented using a reset switch as shown, and with C1=C2. A shift register can be used to provide the series of digital bits corresponding to the digital word input. These are provided in turn, LSB first, to the switched capacitor DAC circuit of FIG. 9. In this circuit a charging capacitor C1 is either charged to Vrefp or Vrefm on each clock cycle depending on the serial digital input. This sampled charge is then switched across an op amp in parallel with the equal second or feedback capacitor C2 which shares this charge, dividing its accumulated charge (accumulated due to the less significant bits received so far) by 2 then adding half the charge from C1 to build up an appropriately binary scaled charge for each bit. On the last (n) bit of the word, the accumulated charge is then transferred to a sample and hold circuit, the charging capacitors C1 and C2 are discharged, and the cycle repeats for the next digital word input. This could also be implemented in differential form.

The skilled person will recognize that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language), or their mixed-signal extensions Verilog-A™ or VHDL-A. As the skilled person will appreciate, the code may be distributed between a plurality of coupled components in communication with one another. Where appropriate, the embodiments may also be implemented using code running on a field-(re) programmable analog array or similar device in order to configure analog hardware, which devices are included in the term "processor" as defined in this application.

The skilled person will also appreciate that the various embodiments and specific features described with respect to them could be freely combined with the other embodiments or their specifically described features in general accordance with the above teaching. The skilled person will also recognize that various alterations and modifications can be made to specific examples described without departing from the scope of the appended claims.

The invention claimed is:

1. A switched capacitor DAC for converting a digital signal and comprising:
   a feedback capacitor coupled between an input and an output of an operational amplifier;
   a charging capacitor and a switching arrangement arranged during a charging period to couple a first side of said charging capacitor to a first reference voltage or a second reference voltage dependent on said digital signal, the switching arrangement further arranged during said charging period to couple a second side of the charging capacitor to the second reference voltage or the first reference voltage in antiphase to the reference voltage coupled to said first side of the charging capacitor;

the switching arrangement further arranged during a settling period to switch said charging capacitor in parallel with said feedback capacitor.

2. A DAC according to claim 1, further comprising a second charging capacitor, the switching arrangement further arranged during said charging period to couple a first side of said second charging capacitor to said first reference voltage or said second reference voltage dependent on a second digital signal, the switching arrangement further arranged during said charging period to couple a second side of the second charging capacitor to the second reference voltage or the first reference voltage in antiphase to the reference voltage coupled to said first side of the second charging capacitor;

the first and second digital signals corresponding to different bits in a digital input word.

3. A DAC according to claim 2, wherein the capacitance values of the first and second charging capacitors correspond with the values associated with their respective bits in the digital word.

4. A DAC according to claim 1, wherein the digital signal is a delta sigma bit stream such that the output voltage level follows the duty cycle of the bit stream.

5. A DAC according to claim 1, wherein the digital signal is a series of bits representing n-bit digital words, the switching arrangement further arranged to discharge the feedback capacitor following the nth bit of each word, such that the output voltage at the end of each word corresponds to an n-bit switched analog voltage following the value of the respective words.

6. A DAC according to claim 1, wherein the operational amplifier is a differential-input, differential-output amplifier and the DAC further comprises:

a complementary feedback capacitor coupled between a second input and a second output of the operation amplifier;

a complementary charging capacitor and a complementary switching arrangement arranged during a charging period to couple a first side of said complementary charging capacitor to said second reference voltage or said first reference voltage dependent on the inverse of said digital signal, the switching arrangement further arranged during said charging period to couple a second side of the complementary charging capacitor to the first reference voltage or the second reference voltage in antiphase to the reference voltage coupled to said first side of the complementary charging capacitor;

the switching arrangement further arranged during a settling period to couple said complementary charging capacitor to said complementary feedback capacitor.

7. A DAC according to claim 1, wherein the first reference voltage is a predetermined fraction of a supply voltage, and the second reference voltage is the appropriate fraction of the supply voltage such that the output of the DAC swings about a virtual ground voltage at half the supply voltage.

8. A DAC according to claim 1, further comprising dynamic element matching (DEM) between capacitor elements in capacitor arrays implemented on an analogue integrated circuit in order to provide the charging capacitors.

9. A digital audio device comprising a DAC according to claim 1, wherein the digital signal is a digital audio signal.

10. A method of converting a digital input signal to an analog signal and comprising applying said input signal to a switched capacitor DAC having:

a feedback capacitor coupled between an input and an output of an operational amplifier;

a charging capacitor and a switching arrangement arranged during a charging period to couple a first side of said charging capacitor to a first reference voltage or a second reference voltage dependent on said digital signal, the switching arrangement further arranged during said charging period to couple a second side of the charging capacitor to the second reference voltage or the first reference voltage in antiphase to the reference voltage coupled to said first side of the charging capacitor;

the switching arrangement further arranged during a settling period to switch said charging capacitor in parallel with said feedback capacitor.

11. A method according to claim 10, wherein the digital signal is a delta sigma bit stream.

12. A method according to claim 10, further comprising first converting the digital signal from a multi-bit signal to a binary signal.

13. Processor code which when implemented on a processor causes the processor to carry out a method according to claim 10.

* * * * *